(12) United States Patent
Dhindsa (10) Patent No.: US 8,313,610 B2
(45) Date of Patent: Nov. 20, 2012

(54) TEMPERATURE CONTROL MODULES FOR SHOWERHEAD ELECTRODE ASSEMBLIES FOR PLASMA PROCESSING APPARATUSES

(75) Inventor: Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1090 days.

(21) Appl. No.: 12/232,809

(22) Filed: Sep. 24, 2008

(65) Prior Publication Data

US 2009/0081878 A1    Mar. 26, 2009

Related U.S. Application Data

(60) Provisional application No. 60/960,331, filed on Sep. 25, 2007.

(51) Int. Cl.
*H01L 21/3065* (2006.01)
(52) U.S. Cl. .............................. 156/345.27; 156/345.34
(58) Field of Classification Search ............. 156/345.37, 156/345.34, 345.27; 438/729; 257/E21.218
See application file for complete search history.

(56) References Cited

U.S. PATENT DOCUMENTS

| | | | |
|---|---|---|---|
| 5,882,411 A | 3/1999 | Zhao et al. | |
| 6,019,060 A | 2/2000 | Lenz | |
| 6,073,577 A | 6/2000 | Lilleland et al. | |
| 6,189,482 B1 | 2/2001 | Zhao et al. | |
| 6,490,146 B2 | 12/2002 | Wang et al. | |
| 6,592,709 B1 | 7/2003 | Lubomirsky | |
| 6,669,783 B2 | 12/2003 | Sexton et al. | |
| 6,823,815 B2 * | 11/2004 | Han et al. | 118/723 E |
| 6,984,288 B2 | 1/2006 | Dhindsa et al. | |
| 2004/0074609 A1 | 4/2004 | Fischer et al. | |
| 2005/0000442 A1 | 1/2005 | Hayashi et al. | |
| 2005/0133160 A1 | 6/2005 | Kennedy et al. | |
| 2005/0241766 A1 | 11/2005 | Dhindsa et al. | |
| 2006/0207502 A1 | 9/2006 | Dhindsa et al. | |
| 2006/0283552 A1 | 12/2006 | Rogers | |
| 2007/0137573 A1 | 6/2007 | Kholodenko et al. | |
| 2008/0149596 A1 * | 6/2008 | Dhindsa et al. | 216/67 |
| 2009/0081878 A1 * | 3/2009 | Dhindsa | 438/729 |

FOREIGN PATENT DOCUMENTS

KR    10-2006-0085358 A    7/2006
WO    WO 00/79575 A1    12/2000

OTHER PUBLICATIONS

International Search Report and Written Opinion mailed Mar. 27, 2009 for PCT/US2008/011052.

* cited by examiner

*Primary Examiner* — Sylvia R. MacArthur
(74) *Attorney, Agent, or Firm* — Buchanan Ingersoll & Rooney PC (57) ABSTRACT

A temperature control module for a showerhead electrode assembly for a semiconductor material plasma processing chamber includes a heater plate adapted to be secured to a top surface of a top electrode of the showerhead electrode assembly, and which supplies heat to the top electrode to control the temperature of the top electrode; a cooling plate adapted to be secured to and thermally isolated from a surface of a top plate of the showerhead electrode assembly, and to cool the heater plate and control heat conduction between the top electrode and heater plate; and at least one thermal choke adapted to control heat conduction between the heater plate and cooling plate.

16 Claims, 6 Drawing Sheets

TEMPERATURE CONTROL MODULES FOR SHOWERHEAD ELECTRODE ASSEMBLIES FOR PLASMA PROCESSING APPARATUSES

CROSS-REFERENCE TO RELATED APPLICATIONS

This application claims priority under 35 U.S.C. 119 to U.S. Provisional Application No. 60/960,331 entitled TEMPERATURE CONTROL MODULES FOR SHOWERHEAD ELECTRODE ASSEMBLIES FOR PLASMA PROCESSING APPARATUSES and filed on Sep. 25, 2007, the entire content of which is hereby incorporated by reference.

BACKGROUND

In the field of semiconductor material processing, semiconductor material processing apparatuses including vacuum processing chambers are used for performing various plasma processes, such as etching of materials on substrates. The effectiveness of these etch processes is often dependent on the ability to control the temperature conditions at certain locations of the processing chambers.

SUMMARY

An exemplary embodiment of a temperature control module for a showerhead electrode assembly for a semiconductor material plasma processing chamber comprises a heater plate having a bottom surface adapted to be secured to a top surface of a top electrode of the showerhead electrode assembly, the top electrode having a plasma-exposed bottom surface, the heater plate including at least one heater adapted to supply heat to the top electrode to control the temperature of the top electrode; a cooling plate having a top surface adapted to be secured to and thermally isolated from a bottom surface of a top plate forming a top wall of the plasma processing chamber, the cooling plate adapted to control the temperature of the heater plate and control heat conduction between the heater plate and the top electrode; and at least one electrically and thermally conductive thermal choke located between, and in contact with, a top surface of the heater plate and a bottom surface of the cooling plate, the at least one thermal choke adapted to control heat conduction between the heater plate and the cooling plate.

An exemplary embodiment of a showerhead electrode assembly for a plasma processing chamber comprises a top plate forming a top wall of the plasma processing chamber; a top electrode including a top surface and a plasma-exposed bottom surface; and a temperature control module comprising: a heater plate having a bottom surface secured to the top surface of the top electrode, the heater plate including at least one heater adapted to supply heat to the top electrode to control the temperature of the top electrode; a cooling plate having a top surface secured to and thermally isolated from a bottom surface of a top plate, the cooling plate adapted to control the temperature of the heater plate and control heat conduction between the heater plate and the top electrode; and at least one electrically and thermal conductive thermal choke located between, and in thermal contact with, a top surface of the heater plate and a bottom surface of the cooling plate, the at least one thermal choke adapted to control heat conduction between the heater plate and the cooling plate.

An exemplary embodiment of a method of controlling the temperature of a top electrode of a showerhead electrode assembly in a plasma processing chamber containing a substrate support having a bottom electrode, the showerhead electrode assembly comprising a top plate forming a top wall of the plasma processing chamber, and a temperature control module located between and secured to the top plate and the top electrode is provided. The method comprises generating plasma in the plasma processing chamber in a gap between the top electrode and the substrate support; applying power from at least one power supply to at least one heater of a heater plate of the temperature control module to heat the top electrode; supplying a temperature-controlled liquid from at least one liquid source to liquid channels of a cooling plate of the temperature control module to control the temperature of the cooling plate; and controlling heat conduction (i) between the cooling plate and the top plate by thermally isolating the cooling plate from the top plate, (ii) between the cooling plate and the heater plate with at least one thermal choke located between the cooling plate and heater plate, and (iii) between the heater plate and the top electrode by controlling the temperature of the heater plate, to thereby maintain the top electrode at a desired temperature.

DETAILED DESCRIPTION

Temperature control modules and showerhead electrode assemblies comprising embodiments of the temperature control modules are provided. The temperature control modules provide an integrated heating and cooling module that allows desirable control of the temperature of the showerhead electrode of the showerhead electrode assemblies. The temperature control modules can be thermally isolated from selected portions of the showerhead electrode assemblies, and have desirably fast response times, to allow reliable and responsive temperature control.

Figure 1:
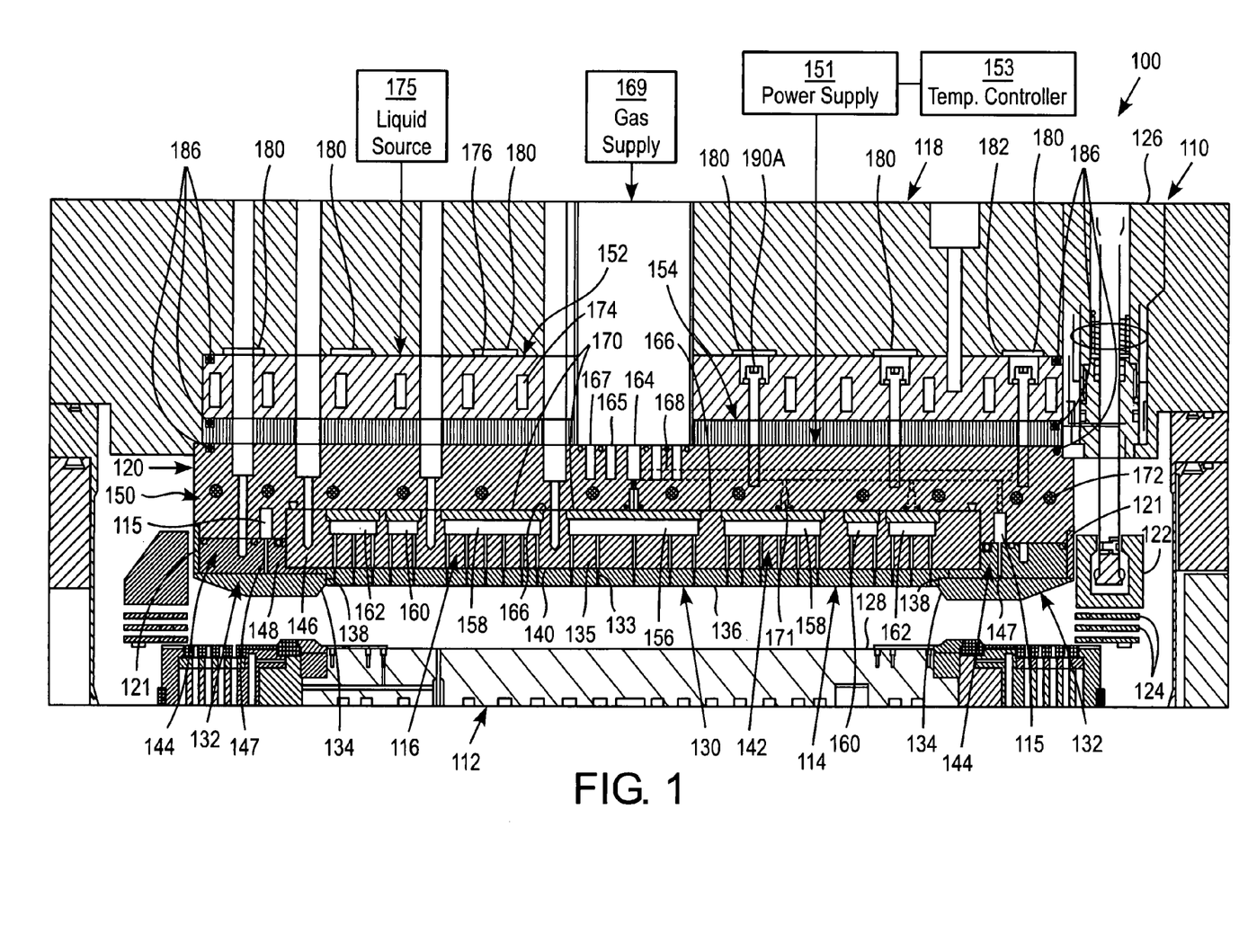
FIG. 1 is a cross-sectional view of a plasma processing chamber of a semiconductor material processing apparatus comprising an exemplary embodiment of a showerhead electrode assembly including a temperature control module.

FIG. 1 illustrates a capacitively-coupled, radio-frequency (RF) plasma processing chamber 100 in which semiconductor substrates, e.g., silicon wafers, are processed. The plasma processing chamber 100 includes an exemplary embodiment of a showerhead electrode assembly 110 and a substrate support 112 (in partial view) positioned below the showerhead electrode assembly 110 with a gap between the showerhead electrode assembly 110 and the substrate support 112 where plasma is generated. The showerhead electrode assembly 110 comprises a top electrode 114, an optional backing member 116 secured to the top electrode 114, a top plate 118 and a temperature control module 120 located between the backing member 116 and top plate 118. A confinement ring assembly 122 surrounds the gap between the top electrode 114 and substrate support 112.

The top plate 118 can be made of aluminum, or the like. Optionally, the temperature of the top plate 118 is controlled by flowing a temperature-controlled liquid (e.g., water at a set temperature and flow rate) through liquid passages formed therein. The top plate 118 can form a removable top wall of the plasma processing chamber 100.

The confinement ring assembly 122 includes a plurality of plasma confinement rings 124 whose vertical positions are adjustable by operation of one or more lift mechanisms 126 to control the vertical gap between adjacent ones of the plasma confinement rings 124. For example, the confinement ring assembly 122 can include three lift mechanisms 126 spaced 1200 apart from each other. The confinement rings 124 enhance confinement of plasma to the gap between the top electrode 114 and the upper surface 128 of the substrate support 112. Exemplary confinement ring assemblies that can be used in the plasma processing chamber 100 are disclosed, e.g., in commonly-owned U.S. Pat. Nos. 6,019,060 and 6,984,288, and U.S. Patent Application Publication Nos. 2006/0207502 and 2006/0283552, each of which is incorporated herein by reference in its entirety.

The substrate support 112 includes a bottom electrode and an optional electrostatic clamping electrode (ESC) for electrostatically clamping a substrate subjected to plasma processing on the upper surface 128 of the substrate support 112.

In the embodiment, the top electrode 114 includes an inner electrode member 130 and an outer electrode member 132, or electrode extension, surrounding the inner electrode member 130. The inner electrode member 130 is a cylindrical plate for plasma processing of circular semiconductor substrates. The inner electrode member 130 can be composed of any suitable material, such as single crystal silicon, polycrystalline silicon or silicon carbide. The inner electrode member 130 includes multiple gas passages 133 through which process gas is injected into the gap between the top electrode 114 and substrate support 112. Plasma is generated in the gap by supplying RF power to the top electrode 114 and/or bottom electrode.

The outer electrode member 132 is configured to expand the diameter of the top electrode 114 for plasma processing larger-diameter substrates in the plasma processing chamber 100. For example, the inner electrode member 130 can have a diameter of 12 inches or 13 inches, and the outer electrode member 132 can be a ring having a radial width that expands the diameter of the top electrode 114 to about 15 inches to 17 inches, or even larger.

The outer electrode member 132 can be a continuous ring (i.e., a one-piece ring), such as a poly-silicon ring. Alternatively, the outer electrode member 132 can include multiple ring segments, e.g., from two to ten segments, arranged to form a ring. The ring segments can be composed, e.g., of single crystal silicon, polycrystalline silicon, or silicon carbide. The ring segments are preferably bonded together. Adjacent ring segments of the outer electrode member 132 preferably have overlapping edges that are bonded to each other with a bonding material. The outer electrode member 132 and inner electrode member 130 can be bonded together, such as with an elastomeric material. The elastomeric material can be any suitable thermally and electrically conductive elastomeric material that can accommodate thermal stresses, and transfer thermal and electrical energy.

As shown in FIG. 1, the outer electrode member 132 can have a thickness greater than that of the inner electrode member 130, or be vertically off-set, to form an inner step 134 extending outwardly at an angle from the plasma-exposed bottom surface 136 of the inner electrode member 130. The angle is preferably an obtuse angle. As also shown in FIG. 1, the inner edge of the outer electrode member 132 is configured to overlap and mate with a recessed outer edge 138 formed in the inner electrode member 130.

In the embodiment, the top surface of the top electrode 114 is secured to the bottom surface of the backing member 116 along a planar interface 140. The backing member 116 includes a backing plate 142 secured to the top surface of the inner electrode member 130 and backing ring 144 surrounding the backing plate 142 and secured to the top surface of the outer electrode member 132. A cover ring 121 is provided on the peripheral outer surface of the backing ring 144. In the embodiment, the backing plate 142 has a larger diameter than the inner electrode member 130. A peripheral portion 146 of the backing plate 142 extends outward in the radial direction from the periphery of the inner electrode member 130 and is supported on a recessed surface 148 formed in the backing ring 144.

The inner electrode member 130 and outer electrode member 132 are secured to the backing plate 142 and backing ring 144, respectively, by a suitable bonding technique. As shown in FIG. 1, the inner electrode member 130 includes surfaces secured to the backing plate 142, outer electrode member 132 and backing ring 144; the outer electrode member 132 includes surfaces secured to the inner electrode member 130 and backing ring 144; the backing plate 142 includes surfaces secured to the inner electrode member 130 and backing ring 144; and the backing ring 144 includes surfaces secured to the backing plate 142, outer electrode member 132 and inner electrode member 130. For example, the surfaces of the inner electrode member 130, outer electrode member 132, backing plate 142 and backing ring 144 can be bonded using an elastomeric bonding material that forms an elastomeric joint between the attached members. The elastomeric material can accommodate thermal stresses, and transfer thermal and electrical energy between the bonded members of the top electrode 114 and backing member 116. Suitable elastomeric bonding materials and techniques for joining the inner electrode member 130, outer electrode member 132, backing plate 142, and backing ring 144 are disclosed in commonly-owned U.S. Pat. No. 6,073,577, which is incorporated herein by reference in its entirety.

The backing plate 142 and backing ring 144 can be composed of various materials. Suitable materials for forming the backing plate 142 include, e.g., aluminum (including aluminum and aluminum alloys, e.g., 6061 Al), graphite and silicon carbide. Aluminum backing plates can have a bare aluminum outer surface (i.e., a native oxide outer surface), or an anodized outer surface formed over all or only portions of the outer surface. The backing ring 144 can be composed of quartz, for example.

In the embodiment, the temperature control module 120 comprises a heater plate 150 secured to the backing plate 142 and backing ring 144, a cooling plate 152 secured to the top plate 118, and a thermal choke 154 located between and secured to the heater plate 150 and cooling plate 152. The cooling plate 152 is attached to the thermal choke 154 and heater plate 150 by fasteners 190A, which are inserted in recessed openings in the cooling plate 152, and extend through aligned openings in the cooling plate 152, thermal choke 154 and heater plate 150. The fasteners 190A preferably include a washer set with a locking washer and slip washer adapted to resist loosening of the fasteners 190A due to thermal expansion and axial and radial movement of the heater plate 150 during thermal cycling of the heater plate 150.

The backing plate 142 includes radially-spaced gas distribution plenums 156, 158, 160, 162. The central plenum 156 is defined by a central recess and a cover plate 170, and the outer plenums 158, 160 and 162 are defined by annular grooves in the backing plate 142 and by cover plates 170. Adjacent pairs of the plenums 156, 158; 158, 160; and 160, 162 are separated from each other by respective annular projections 166. The cover plates 170 can comprise the same material as the backing plate 142, for example. The cover plate 170 for the central plenum 156 preferably has a disc shape, and the cover plates 170 for the outer plenums 158, 160 and 162 preferably have annular ring configurations The cover plates 170 are preferably bonded to the backing plate 142 to prevent gas leakage from the plenums 156, 158, 160 and 162. In one embodiment, cover plate 170 can be welded or brazed to backing plate 142.

Each of the plenums 156, 158, 160, 162 is in fluid communication with a plurality of gas passages 135 in the backing plate 142. Process gas is supplied from a gas supply 169 to the central plenum 156 via a gas passage 164 in the heater plate 150. Gas is distributed to the outer plenums 158, 160, 162 via gas passages 165, 167 in fluid communication with the gas supply 169 and radial gas distribution channels 168 and axial passages 171 formed in the heater plate 150.

The gas passages 135 in the backing plate 142 are aligned with respective gas passages 133 in the inner electrode member 130 to supply process gas from the gas supply 169 into the plasma processing chamber 100. As shown, the gas passages 135 in the backing plate 142 can have a larger diameter than the gas passages 133 in the inner electrode member 130. For example, the gas passages 135 can have a diameter of about 0.04 inch, and the gas passages 133 can have a diameter of about 0.020 inch to about 0.025 inch. The backing ring 144 includes gas passages 147 in fluid communication with radial gas distribution channels 168 in the heater plate 150 and with gas passages in the outer electrode member 132 to supply process gas into the chamber.

The temperature control module 120 is an integrated unit adapted to adjust and maintain control of the temperature of the top electrode 114 in the showerhead electrode assembly 110 when plasma is being generated in the plasma processing chamber (i.e., the plasma "ON" condition) and when plasma is not being generated (i.e., the plasma "OFF" condition). The temperature control module 120 is adapted to supply a controlled amount of heat to the top electrode 114, and remove heat from the top electrode 114, to maintain the top electrode 114 at a desired temperature. The temperature control module 120 provides reliable and repeatable control of the temperature of the plasma-exposed, bottom surface 136 of the top electrode 114. For example, for the electrode, a center-to-edge maximum temperature gradient of about ±30° C., or even less, can be achieved with the temperature control module 120. By more closely controlling the temperature of, and radial temperature gradient across, the bottom surface 136 of the top electrode 114, the plasma chemistry at the bottom surface 136 can be better controlled.

The heater plate 150 is adapted to supply heat to the top electrode 114 by thermal conduction through the backing member 116. The heater plate 150 can be a machined piece or casting of metal, such as aluminum, an aluminum alloy, or the like. The heater plate 150 can include one or more heaters operable to provide the desired heating capacity in the heater plate 150. As shown in FIG. 1, the heater plate 150 can include radially-spaced, internal heating elements 172 within the heater plate 150 (e.g., embedded). The heating elements 172 can be circular and concentrically arranged, as shown. For example, in FIG. 1, the central circular heating element is depicted by the two cross-sections of the heating element 172 disposed over the plenum 156, and the outermost circular heating element is depicted by the two outermost heating elements 172 located below seals 186. FIG. 1 shows six circular heating elements. The heating elements 172 can be symmetrically arranged with respect to each other. The heating elements 172 are electrically connected to a single power supply 151, or to multiple power supplies, which supply power to the heating elements 172. For example, each heating element 172 can be connected to a separate power supply, or groups of two or more heating elements 172 can be connected to respective power supplies. The one or more power supplies 151 can optionally supply different amounts of power to the individual heating elements 172 (or to groups of the heating elements) to allow variable controlled heating of different regions or zones of the heater plate 150. For example, during operation of the showerhead electrode assembly 110, the heater plate 150 is operable to supply a known amount of heat to the top electrode 114 in order to maintain the inner electrode member 130 and outer electrode member 132 at, or sufficiently close to, the desired temperature, e.g., a temperature set point. For example, the top electrode 114 can be maintained within about ±5° C. or less of the temperature setpoint by operation of the temperature control module 120.

The showerhead electrode assembly 110 can include a temperature sensor arrangement of one or more temperature sensors located, e.g., on the backing member 116. The respective temperature sensors can monitor the temperature at a respective portion of the top electrode 114 and supply this temperature information to a temperature controller 153. The temperature controller 153 controls the at least one power supply 151 to supply power to the heating elements 172 to heat the top electrode 114. The at least one power supply 151 is controlled to supply power to the heating elements 172 based on the actual and desired temperature of the top electrode 114. For example, prior to plasma etching of a semiconductor substrate, the heater plate 150 can be activated to heat the top electrode 114 when the plasma is OFF. The heater plate 150 is preferably also activated as needed, but at a lower power level, when the plasma is ON, so that a desired temperature of the top electrode 114 can be maintained.

In the temperature control module 120, the cooling plate 152 is adapted to cool the heater plate 150 and control heat conduction between the heater plate 150 and the inner electrode member 130 and outer electrode member 132. The cooling plate 152 has a small "thermal mass" for the following reasons.

The rate at which a body can be heated or cooled is related to the body's heat capacity, or "thermal mass", C. The thermal mass equals the product of the specific heat, c, of the material of the body, and the mass, m, of the body, i.e., $C=c\cdot m$ (Equation 1). Accordingly, the thermal mass of a body can be varied by changing its mass, e.g., by changing the volume of the material forming the body by making the body smaller and/or porous. Also, the amount of heat, q, that needs to be added to a body from a heat source by heating the body, or given off by the body by cooling the body, in order to change the body's temperature by an amount $\Delta T$ is given by: $q=mc\Delta T$ (Equation 2). Thus, as the thermal mass of a body is decreased, the amount of heat, q, that must be added to or removed from the body in order to change the body's temperature by an amount $\Delta T$ is also decreased.

When the body is in physical contact with a heat source such that heat is transferred from the heat source to the body by conduction, when the temperature of the body increases when it absorbs heat, the temperature difference between the contact surfaces of the heat source and the body will decrease, which, in turn, will reduce the rate of heat transfer from the heat source to the body. Accordingly, the rate of heat transfer from the heat source to the body can be more closely controlled by reducing the thermal mass of the body.

The cooling plate 152 can provide dynamic temperature control capabilities in the temperature control module 120 because the cooling plate 152 has a small thermal mass (so that the amount of heat, q, that must be added to or removed from the cooling plate 152 in order to change its temperature by an amount ΔT is reduced), and the cooling plate 152 is thermally isolated from the top plate 118.

The cooling plate 152 is composed of a thermally and electrically conductive material, such as aluminum, an aluminum alloy, or the like. The cooling plate 152 can be a single piece of material, such as a casting. In another embodiment, the cooling plate 152 can include two pieces bonded together along opposed major faces of the pieces. The cooling plate 152 preferably has a small volume. As shown in FIG. 1, the cooling plate 152 can have a diameter that approximates the outer diameter of the outer electrode member 132. For example, the cooling plate 152 can have a diameter of about 15 inches to 17 inches. The cooling plate 152 can have a small thickness of only about 1 inch to about 2 inch, for example.

The cooling plate 152 is temperature controlled. As shown in FIG. 1, the cooling plate 152 includes liquid channels 174 through which a temperature-controlled liquid is flowed from at least one liquid source 175 to cool the cooling plate 152. The liquid channels 174 can be internal passages formed in a single-piece cooling plate 152. Alternatively, the liquid channels 174 can be passages defined between separate pieces of a multi-piece cooling plate 152. The liquid can be de-ionized water, for example. The liquid source 175 preferably supplies a small volume of the liquid to the liquid channels 174 to allow fast cooling. The liquid has a desired temperature and flow rate to provide the desired heat transfer capabilities to the cooling plate 152. The temperature-controlled liquid can maintain the cooling plate 152 at a temperature of about 20° C. to about 40° C., for example. The liquid channels 174 also decrease the mass of the cooling plate 152, which reduces the thermal mass of the cooling plate 152. In the temperature control module 120, the cooling capacity of the cooling plate 152 preferably exceeds heating effects on the top electrode 114 caused by plasma generated in the gap between the top electrode 114 and substrate support. This cooling capacity allows the temperature control module 120 to minimize the frequency and magnitude of overshooting of the temperature set point of the top electrode 114 when the plasma is ON.

In addition to having a small mass, the cooling plate 152 is preferably thermally isolated from the top plate 118 in the showerhead electrode assembly 110 to reduce heat conduction between the cooling plate 152 and top plate 118. The top plate 118 has a significantly greater thermal mass than the cooling plate 152. In the embodiment, the cooling plate 152 is thermally isolated from the top plate 118 by reducing the total contact surface area at the interface 176 between the top plate 118 and the cooling plate 152. For example, the ratio of the contact surface area at the interface 176 to the total surface area of the top surface of the cooling plate 152 facing the top plate 118 can be about 20% to 30%. In the embodiment, at least one groove is formed in the bottom surface of the top plate 118. For example, as shown in FIG. 1, the at least one groove can comprise multiple, radially-spaced, concentrically-arranged grooves 180. The grooves 180 can have an annular configuration. Adjacent grooves 180 are separated by projections 182 (which can be annular projections) on the bottom surface of the top plate 118. The projections 182 are in thermal contact with the top surface of the cooling plate 152. Heat conduction between the cooling plate 152 and the top plate 118 occurs primarily at the annular projections 182. Alternatively, a single continuous groove (e.g., with concentric portions) can be formed in the bottom surface of the top plate 118. This thermal isolation of the cooling plate 152 from the top plate 118 causes heat conduction to be primarily between the heater plate 150 and small cooling plate 152, and not between the heater plate 150 and the top plate 118, which has a significantly larger thermal mass than the cooling plate 152.

In the embodiment, the thermal choke 154 is located between the heater plate 150 and cooling plate 152 to control heat conduction between these plates. The thermal choke 154 provides "thermal resistance" to heat flow from the heater plate 150 to the cooling plate 152 to allow enhanced control of the rate of heat conduction from the heater plate 150 to the cooling plate 152. The meaning of the term "thermal resistance" is described below. The thermal choke 154 is also preferably sufficiently flexible to compensate for radial and axial expansion of the heater plate 150 caused by thermal cycling during operation of the showerhead electrode assembly 110.

For one-dimensional, steady-state heat transfer conditions, the heat transfer rate, q, across a material is given by: $q=kA(T_1-T_2)/L$ (Equation 3), where k is the thermal conductivity of the material, A is the cross-sectional area of the material in the direction perpendicular to the direction of heat transfer; $T_1$ is the temperature at one face of the material and $T_2$ is the temperature at an opposite face of the material ($\Delta T=T_1-T_2$, where ΔT can be positive or negative); and L is the length of the material along which the heat transfer occurs. Equation 3 can be rearranged as: $q=\Delta T/(L/kA)$ (Equation 4). In Equation 4, the term L/kA is referred to as the "thermal resistance" of the material. Equation 4 shows that at a given value of ΔT, increasing the thermal resistance of the material decreases the heat transfer rate, q, along the length of the material that heat transfer occurs. The thermal resistance can be increased by increasing L, decreasing k and/or decreasing A.

In the embodiment, the thermal choke 154 is a plate having planar opposed surfaces secured to the heater plate 150 and cooling plate 152. These members can be secured, e.g., by elastomer bonding, brazing, welding, or fasteners. As shown in FIG. 1, seals 186, such as O-rings, are placed between the top plate 118 and cooling plate 152, cooling plate 152 and thermal choke 154, and thermal choke 154 and heater plate 150, to provide vacuum seals.

The thermal choke 154 can be composed of the same material as the heater plate 150 and cooling plate 152, for example. For example, the thermal choke 154 can be made from anodized or non-anodized aluminum or aluminum alloys (e.g., 6061-T6 or 7075-T6 aluminum). The thermal choke 154 can alternatively be made of other metals, non-metallic materials or composite materials having desirable thermal conductivity and structural characteristics. The thermal choke 154 has a structure effective to provide the desired thermal resistance between the heater plate 150 and cooling plate 152. For example, the thermal choke 154 can have a honeycomb, perforated plate, corrugated plate, or other suitable porous structure to provide the desired thermal resistance. These exemplary structures increase "L" and/or decrease "A" in Equation 4 above, which increases the thermal resistance of the thermal choke 154.

In another embodiment, the thermal choke 154 can be a laminate structure including for example, aluminum layers and at least one intermediate layer of a metallic or non-metallic thermally and electrically conductive material (e.g., a polymeric material or stainless steel) having a lower "k" value (see Equation 4) than the aluminum layers to increase the thermal resistance of the thermal choke. The thermal choke 154 can have a total thickness of about 0.25 inch to about 1 inch, for example.

By operation of the temperature control module 120, the top electrode 114 can be maintained at a desired temperature during and between successive substrate processing runs, so that multiple substrates can be processed more uniformly, thereby improving process yields. In an exemplary embodiment, the temperature control module 120 can maintain the top electrode 114 at a temperature set point within the range of about 40° C. to about 200° C., such as at least about 100° C., at least about 150° C., or at about least 180° C. The desired temperature of the top electrode 114 will depend on the particular plasma process that is being run in the plasma processing chamber 110. For example, dielectric material etch processes utilize high applied power levels to the top electrode 114 and/or bottom electrode and produce high corresponding top electrode 114 temperatures.

The small mass of the cooling plate 152, in combination with the thermal resistance of the thermal choke 154 and thermal isolation of the cooling plate 152 from the top plate 118, allows closer and more rapid control of the rate of heat transfer between the heater plate 150 and the cooling plate 152, as compared to the heater plate 150 being in direct thermal contact with the top plate 118. By improving the control of heat conduction between the heater plate 150 and the cooling plate 152, the heater plate 150 can more closely control the temperature of the top electrode 114. The temperature control module 120 also provides a desirably fast response time for controlling the top electrode 114 temperature The response time is the rate at which the control module 120 ramps up during heating and ramps down during cooling when the heater plate 150 is turned on and off, respectively.

Figure 2:
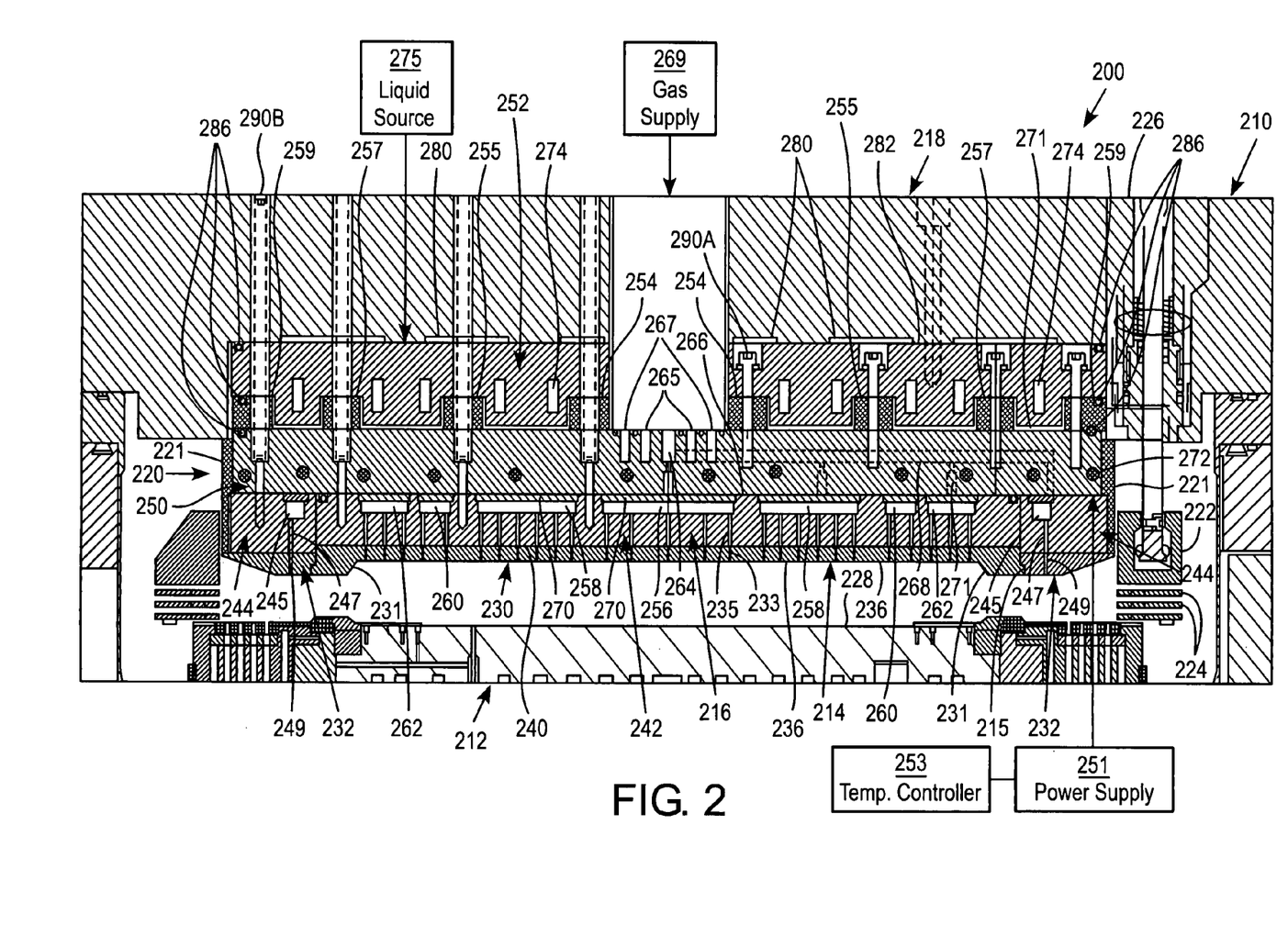
FIG. 2 is a cross-sectional view of a plasma processing chamber of a semiconductor material processing apparatus comprising another exemplary embodiment of a showerhead electrode assembly including a temperature control module.

FIG. 2 illustrates a plasma processing chamber 200 comprising another exemplary embodiment of a showerhead electrode assembly 210. As shown in FIG. 2, the showerhead electrode assembly 210 comprises a top electrode 214, backing member 216 secured to the top electrode 214, top plate 218 and a temperature control module 220 located between the backing member 216 and top plate 218. A plasma confinement ring assembly 222 surrounds the top electrode 214 in the plasma processing chamber 200. A substrate support 212 (in partial view) is disposed beneath the top electrode 214. As described below, the top electrode 214 and temperature control module 220 have different structural features than the top electrode 114 and temperature control module 120 shown in FIG. 1.

In the embodiment shown in FIG. 2, the top electrode 214 includes an inner electrode member 230 and an outer electrode member 232 surrounding the inner electrode member 230. The inner electrode member 230 is a single piece of material including a step 231 of increased thickness extending outwardly, preferably at an obtuse angle, from the bottom surface 236 of the thinner inner portion of the inner electrode member 230. The inner electrode member 230 includes multiple gas passages 233 through which process gas is injected into the space (gap) between the top electrode 214 and substrate support 212. The outer electrode member 232 expands the diameter of the top electrode 214, and can be a continuous ring or include multiple ring segments. As shown in FIG. 2, the outer electrode member 232 and inner electrode member 230 include mating projections 215 with a lower projection on step 231 overlapping, and preferably interlocking with, an upper projection on outer electrode 232.

In the embodiment, the backing plate 242 is secured to the top surface of the inner electrode member 230 along an interface 240, and the backing ring 244 is secured to the top surface of the outer electrode member 232. As shown, the backing plate 242 has approximately the same diameter as the inner electrode member 230. The inner electrode member 230 and outer electrode member 232 are secured to the backing plate 242 and backing ring 244, respectively, by a suitable bonding technique. As shown in FIG. 2, the inner electrode member 230 includes surfaces secured to the backing plate 242, outer electrode member 232 and backing ring 244; the outer electrode member 232 includes surfaces secured to the inner electrode member 230 and backing ring 244; the backing plate 242 includes surfaces secured to the inner electrode member 230 and backing ring 244; and the backing ring 244 includes surfaces secured to the backing plate 242, outer electrode member 232 and inner electrode member 230. For example, these surfaces can be bonded together using a thermally and electrically conductive elastomeric bonding material.

The temperature control module 220 comprises a heater plate 250 attached to the backing plate 242 and backing ring 244, and a cooling plate 252 attached to the heater plate 250 and top plate 218. A cover ring 221 is provided on the radial outer surfaces of the heater plate 250 and the backing ring 244.

The backing plate 242 includes a plurality of gas distribution plenums 256, 258, 260, 262, each of which is in fluid communication with a plurality of gas passages 235 in the backing plate 242. The central plenum 256 is defined by a central recess and a cover plate 270, and the plenums 258, 260, 262 are defined by annular grooves and cover plates 270. The cover plates 270 are preferably bonded to the backing plate 242. In one embodiment, cover plate 270 can be welded or brazed to backing plate 242. Process gas is supplied to the central plenum 256 via a gas passage 264. Adjacent pairs of the plenums 256, 258; 258, 260; 260, 262, are separated by annular projections 266 on the backing plate 242. Gas is supplied to the outer plenums 258, 260, 262 via gas passages 265, 267 and radial gas distribution channels 268 and axial passages 271 in the heater plate 250.

The gas passages 235 in the backing plate 242 are aligned with respective gas passages 233 in the inner electrode member 230 to supply gas into the plasma processing chamber 200. The backing ring 244 includes a plenum 245 in fluid communication with the gas distribution channels 268 in the heater plate 250, gas passages 247 in the backing ring 244, and gas passages 249 in the outer electrode member 232. Gas is supplied into the chamber via the gas passages 249.

The heater plate 250 includes heating elements 272 adapted to supply heat in a controlled manner to the top electrode 214 through the backing member 216. The heater plate 250 is operable to maintain the inner electrode member 230 and outer electrode member 232 at the desired temperature. The heating elements 272 are electrically connected to a single power supply 251, or to multiple power supplies. A temperature sensor arrangement can be provided on the backing member 216 to monitor the temperature of the top electrode 214 and supply this temperature information to a temperature controller 253. The temperature controller is adapted to control the at least one power supply 251 to supply power to the heater plate 250 to heat the inner electrode member 230 and outer electrode member 232. The heater plate 250 can operate in the same manner described above in regard to the heater plate 150.

As described above, the cooling plate 252 is adapted to cool the heater plate 250 and control heat transfer between the heater plate 250 and top electrode 214. The cooling plate 252 can provide close control of this heat transfer rate. The cooling plate 252 has a small mass, and is made of a thermally and electrically conductive material. As shown in FIG. 2, the cooling plate 252 can have a diameter that is close to the diameter of the inner electrode member 230 and outer electrode member 232. For example, the cooling plate 252 can have a diameter of about 15 inches to 17 inches, and a small thickness of only about 1 inch to about 2 inch.

The cooling plate 252 includes liquid channels 274, into which a temperature-controlled liquid having a desired temperature is supplied from a single liquid source 275, or from more than one liquid source. The temperature-controlled liquid can maintain the cooling plate 252 at a temperature of about 20° C. to about 40° C., for example. The cooling capacity of the cooling plate 252 is preferably sufficient to minimize overshooting of the temperature of the top electrode 214 caused by plasma heating effects.

The cooling plate 252 is thermally isolated from the top plate 218 by at least one groove 280 formed in the bottom surface of the top plate 218. The one or more grooves 280 are separated by projections 282 (e.g., annular projections) in thermal contact with the top surface of the cooling plate 252. Heat is conducted between the top plate 218 and cooling plate 252 primarily via the annular projections 282. The ratio of the contact surface area between the top plate 218 and cooling plate 252 at the projections to the total surface area of the top surface of the cooling plate 252 facing the top plate 218 can be about 20% to 30%, for example.

In this embodiment, one or more thermal chokes are placed between the heater plate 250 and cooling plate 252 to provide enhanced control of the rate of heat conduction between the heater plate 250 and cooling plate 252. As shown in FIG. 2, a plurality of thermal chokes 254, 255, 257 and 259 can be placed between the heater plate 250 and cooling plate 252. The thermal chokes 254, 255, 257 and 259 are concentrically-arranged annular rings placed in respective grooves formed in the bottom surface of the cooling plate 252. The rings can be one-piece, continuous rings, or can include two or more ring segments. Fasteners 290A are received in aligned openings in the top plate 218; cooling plate 252; thermal chokes 254, 255, 257 and 259; heater plate 250 and backing plate 242. The thermal chokes 254, 255, 257 and 259 can be composed of the same material as the heater plate 250 and cooling plate 252, or of other metals or non-metallic materials having suitable thermal conductivity and structural characteristics. For example, the thermal chokes 254, 255, 257 and 259 can be composed of stainless steels having a lower thermal conductivity than aluminum used for the heater plate 250 and/or cooling plate 252.

Figure 3:
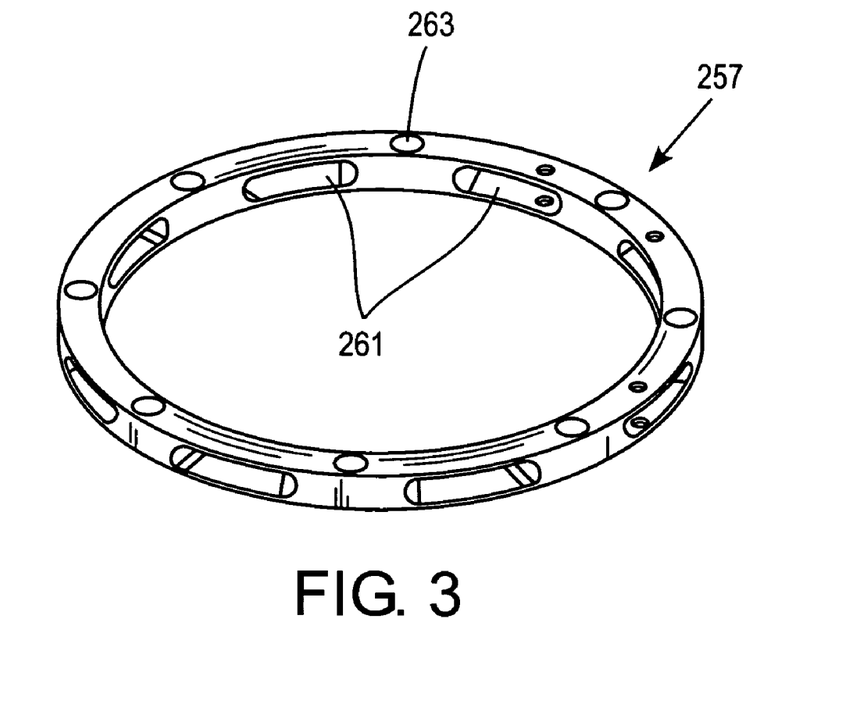
FIG. 3 illustrates an exemplary embodiment of a thermal choke of the temperature control module shown in FIG. 2.

FIG. 3 shows an exemplary embodiment of the thermal choke 257. The thermal chokes 254, 255, which have different sizes than the thermal choke 257, can have the same composition and structure as the thermal choke 257. As shown in FIG. 3, the thermal choke 257 includes radial through openings 261 for reducing the cross-sectional area for heat conduction, and thus increase the thermal resistance of the thermal choke 257. In another embodiment, the thermal choke 257 can be a porous sintered ring, e.g., a stainless steel ring, made by powder metallurgy. The thermal chokes 254, 255 can also be porous sintered rings. The porous sintered rings can be fabricated with a desired pore structure to provide a desired thermal resistance. The thermal choke 257 (and thermal chokes 254, 255) also include circumferentially-spaced, axially-extending openings 263 for receiving threaded fasteners 290A.

Figure 4:
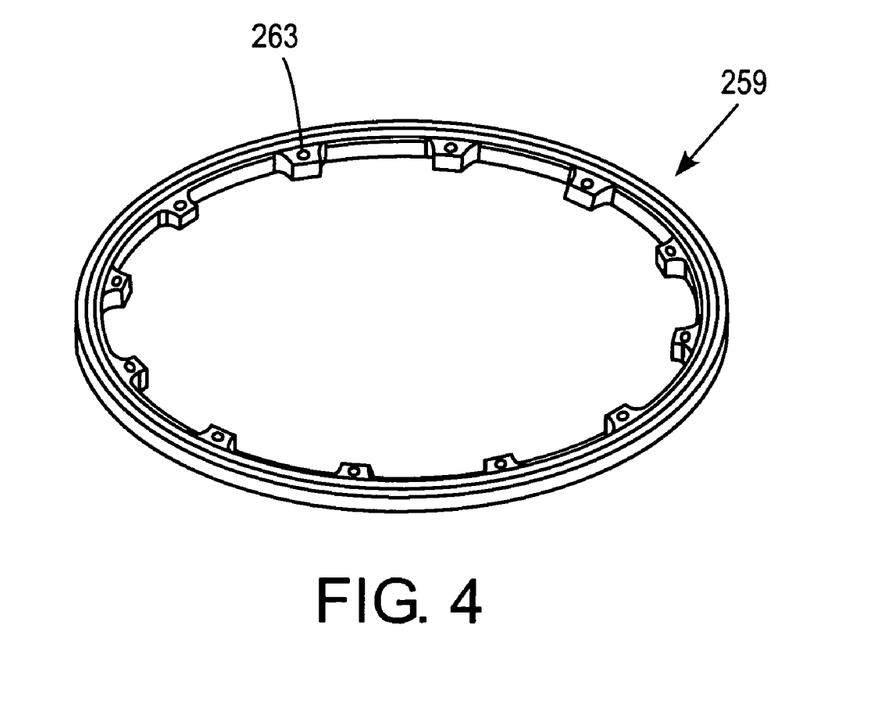
FIG. 4 illustrates an exemplary embodiment of another thermal choke of the temperature control module shown in FIG. 2.

FIG. 4 shows an exemplary embodiment of the outermost thermal choke 259. As shown in FIG. 2, the thermal choke 259 forms part of the radial outer surface of the cooling plate 252. The thermal choke 259 is preferably non-porous (i.e., has a density equal to the theoretical density of the material forming the thermal choke). A plurality of inwardly-extending projections include circumferentially-spaced apart, axially-extending openings 263 for receiving threaded fasteners 290A.

As shown in FIG. 2, each of the thermal chokes 254, 255, 257 and 259 has a greater height (i.e., in the axial direction) than the height of the respective grooves formed in the cooling plate 252 so that the cooling plate 252 is supported on the thermal chokes 254, 255, 257 and 259, and an axial gap 271 is defined between the bottom surface of cooling plate 252 and the top surface of the heater plate 250. The gap 271 eliminates direct physical contact between the heater plate 250 and cooling plate 252 and forces heat conduction to occur between the heater plate 250 and cooling plate 252 through the thermal chokes 254, 255, 257 and 259.

The thermal chokes 254, 255, 257 and 259 can have an exemplary height of about 0.25 inch to about 0.75 inch, such as about 0.5 inch, and an exemplary width of about 0.5 inch to about 1 inch, such as about 0.75 inch. The thermal choke 254 can have an outer diameter of about 2 inches to about 4 inches, the thermal choke 255 can have an outer diameter of about 6 inches to about 8 inches, the thermal choke 257 can have an outer diameter of about 10 inches to about 12 inches, and the thermal choke 259 can have an outer diameter of about 15 inches to about 17 inches, for example. As shown, seals 286, such as O-rings, are placed between the cooling plate 252 and the top plate 218, the cooling plate 252 and the thermal choke 259, and the thermal choke 259 and the heater plate 250 to form vacuum seals.

In the embodiment, the cooling plate 252 is fastened to the heater plate 250 with threaded fasteners 290A. Each of the fasteners 290A preferably includes a washer set 273 with a locking washer and slip washer to resist loosening of the fasteners 290A due to temperature cycling and thermal expansion and movement of the heater plate 250.

Accordingly, in this embodiment, the small mass of the cooling plate 252, in combination with the thermal resistance provided by the thermal chokes 254, 255, 257 and 259, and thermal isolation of the cooling plate 252 and top plate 218, allows improved control of the rate of heat transfer between the heater plate 250 and the cooling plate 252, as compared to the heater plate 250 being in direct contact with the top plate 218. The temperature control module 220 allows the temperature of the top electrode 214 to be more closely controlled. In addition, the integrated temperature control module 220 provides a desirably fast response time for controlling the top electrode 214 temperature.

Figure 5:
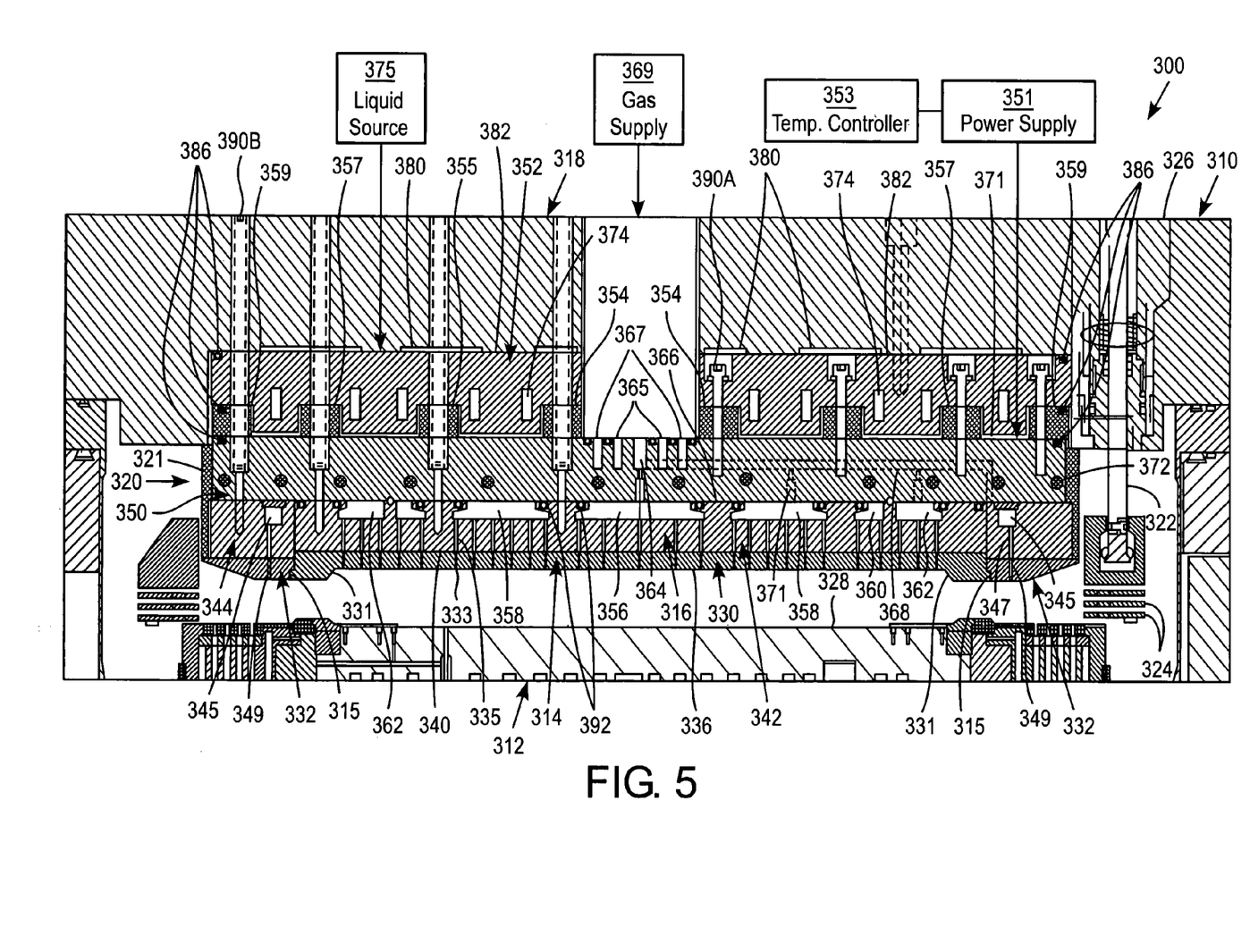
FIG. 5 is a cross-sectional view of a plasma processing chamber of a semiconductor material processing apparatus comprising another exemplary embodiment of a showerhead electrode assembly including a temperature control module.

FIG. 5 illustrates a plasma processing chamber 300 of a semiconductor material plasma processing apparatus comprising another exemplary embodiment of a showerhead electrode assembly 310. As shown in FIG. 5, the showerhead electrode assembly 310 comprises a top electrode 314, a backing member 316 secured to the top electrode 314, a top plate 318 and a temperature control module 320 disposed between the backing member 316 and top plate 318. A confinement ring assembly 322 surrounds the top electrode 314 in the plasma processing chamber 300. A substrate support 312 (shown in partial view) including a bottom electrode and optional electrostatic clamping electrode is disposed beneath the top electrode 314.

The illustrated showerhead electrode assembly 310 includes a backing plate 342 and backing ring 344. The backing plate 342 includes plenums 356, 358, 360 and 362. The showerhead electrode assembly 310 has the same structure as the showerhead electrode assembly 210 except for the different structure of the backing plate 342. As shown in FIG. 5, the plenums 356, 358, 360 and 362 have a width that increases in the axial direction toward the top electrode 314. This enlargement of the width of the plenums provides sufficient area for placing seals 392, such as O-rings, between the backing plate 342 and heater plate 350 to prevent gas leakage from the plenums, as well as provides sufficient thermal contact area between the top surface of the backing plate 342 and the bottom surface of the heater plate 350.

During disassembly of backing plate 342 from top electrode 314 for routine maintenance, the backing plate 342 configuration of FIG. 5 facilitates the ability to clean the interior surfaces of plenums 356, 358, 360 and 362 without removal of an overlying cover plate (e.g., cover plates 170/270 from FIGS. 1 and 2).

Figure 6:
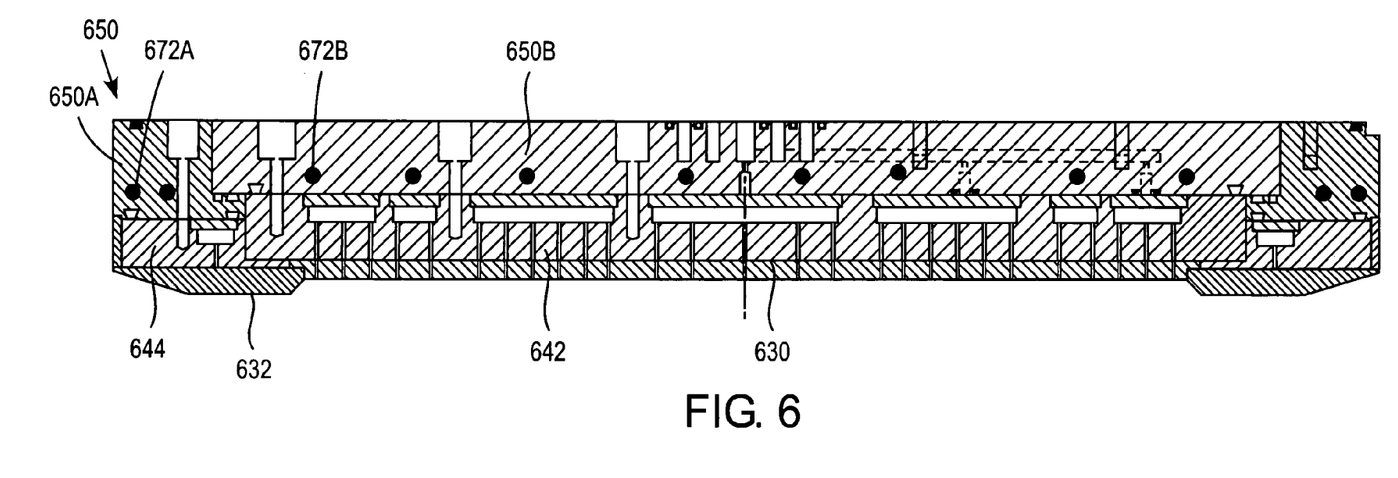
FIG. 6 is a cross-sectional view of another embodiment of a heater plate including outer heater plate and inner heater plate.

FIG. 6 illustrates an embodiment of heater plate 650 which includes outer heater plate 650A and inner heater plate 650B for independent temperature control over outer electrode member 632 and inner electrode member 630. Outer heater plate 650A includes heating elements 672A and inner heater plate 650B includes heating elements 672B, in which heating elements 672A and 672B are individually connected to the same or separate power supplies. The outer heater plate 650A can be secured to backing ring 644 using suitable fasteners; and the outer electrode member 632 can be bonded to backing ring 644. The inner heater plate 650B can be secured to backing plate 642 by suitable fasteners; and the inner electrode member 630 can be bonded to backing plate 642. The embodiment of FIG. 6 provides temperature control of outer electrode backing member 632 independently of inner electrode member 630. It should be noted that heater plate 650 of FIG. 6 can be used in any of the embodiments of FIG. 1, 2 or 5.

Figure 7:
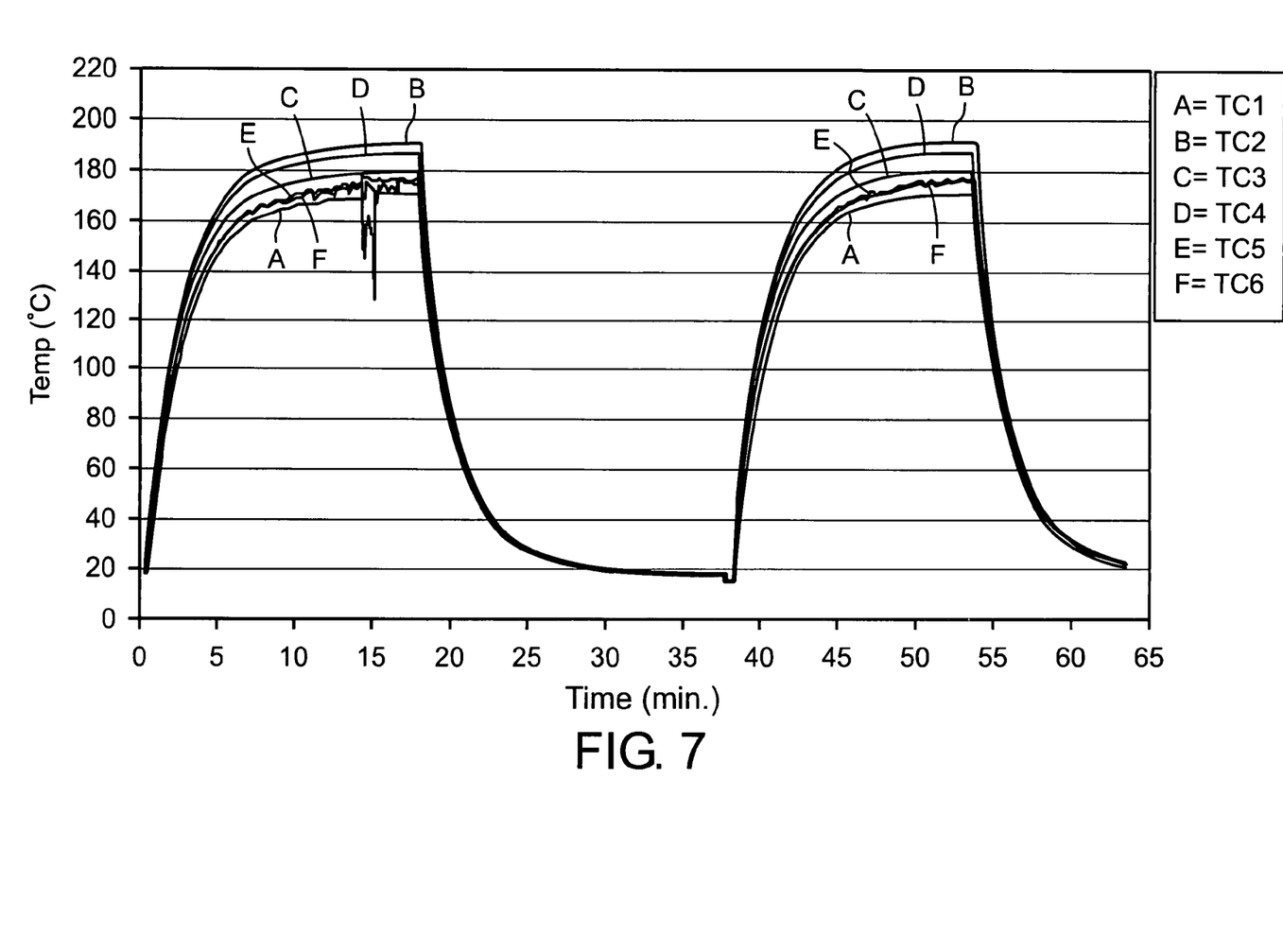
FIG. 7 illustrates the temperature versus time (ramp-up and ramp-down rate) of an exemplary embodiment of a temperature control module.

FIG. 7 shows the temperature versus time response for an exemplary embodiment of a showerhead electrode assembly including a top electrode including an inner electrode member, an outer electrode member, a backing plate and backing ring attached to the inner and outer electrode members, and a temperate control module attached to the backing plate and backing ring and to a top plate. The temperature control module included thermal choke rings between the cooling plate and heater plate. The thermal choke rings included a center stainless steel ring, an outermost stainless steel ring, and an aluminum ring between the center and outermost rings. The heater power was 7 kW, a coolant at a temperature was flowed through the cooling plate, the heater was on for about 17 minutes and off for about 17 minutes. The temperature set point of the top electrode was 200° C. The ramp-up rate during heating (with heater power turned on) and ramp-down rate during cooling (with heater power turned off) response for the temperature control module for several cycles, was measured by multiple thermocouples A to F located at different locations across the top electrode.

The response time for embodiments of the temperature control modules that include one or more thermal choke rings located between the cooling plate and heater plate can be optimized to the desired operating range by optimizing the design (configuration and composition) of the thermal choke ring(s) to control heat conduction between these plates in the temperature control modules. In other embodiments of the temperature control module that include a thermal choke plate, the configuration and composition of the thermal choke plate can be optimized to control heat conduction between the cooling plate and heater plate.

While the invention has been described in detail with reference to specific embodiments thereof, it will be apparent to those skilled in the art that various changes and modifications can be made, and equivalents employed, without departing from the scope of the appended claims.

What is claimed is:

1. A temperature control module for a showerhead electrode assembly for a semiconductor material plasma processing chamber, the temperature control module comprising:
    a heater plate having a bottom surface adapted to be secured to a top surface of a top electrode of the showerhead electrode assembly, the top electrode having a plasma-exposed bottom surface, the heater plate including at least one heater adapted to supply heat to the top electrode to control the temperature of the top electrode;
    a cooling plate having a top surface adapted to be secured to and thermally isolated from a bottom surface of a top plate forming a top wall of the plasma processing chamber, the cooling plate adapted to control the temperature of the heater plate and control heat conduction between the heater plate and the top electrode; and
    a plurality of electrically and thermally conductive thermal chokes located between, and in contact with, a top surface of the heater plate and a bottom surface of the cooling plate, the thermal chokes adapted to control heat conduction between the heater plate to the cooling plate;
    wherein the thermal chokes comprise at least one first ring and a second ring surrounding the first ring, the second ring being non-porous and forming an outer surface of the temperature control module.

2. The temperature control module of claim 1, wherein:
    the heater plate comprises a piece of a metal having heating elements embedded therein, and gas distribution passages adapted to be in fluid communication with a gas supply and with gas distribution plenums in a backing member of the showerhead electrode assembly, the heating elements adapted to be connected to at least one power supply operable to supply power to the heating elements; and
    the cooling plate comprises a piece of a metal having liquid channels formed therein, the liquid channels are adapted to be in fluid communication with at least one source of a temperature-controlled liquid which is supplied to the liquid channels to control the temperature of the cooling plate.

3. The temperature control module of claim 1, wherein:
    the cooling plate comprises a plurality of radially-spaced, concentrically-arranged first grooves in the bottom surface, each of the first grooves has a first height; and
    each thermal choke is a ring disposed in a respective first groove in the cooling plate, each thermal choke is concentrically arranged with respect to each other, each thermal choke has a second height which is greater than the first height of the respective first groove in which each thermal choke is disposed such that each thermal choke supports the cooling plate on the heater plate, a gap is defined between the bottom surface of the cooling plate and the top surface of the heater plate, and heat is conducted between the heater plate and cooling plate through the rings.

4. The temperature control module of claim 3, wherein the first ring includes a plurality of through openings.

5. The temperature control module of claim 3, wherein the first ring is a sintered porous metallic body.

6. The temperature control module of claim 1, wherein:
the cooling plate, the thermal chokes and heater plate comprise aligned openings; and
a threaded fastener is received in each of the aligned openings to secure the cooling plate, the thermal chokes and heater plate to each other, each threaded fastener includes a washer set adapted to resist loosening of the fastener due to thermal cycling of the heater plate.

7. A showerhead electrode assembly for a plasma processing chamber, comprising:
a top plate forming a top wall of the plasma processing chamber;
a top electrode including a top surface and a plasma-exposed bottom surface; and
a temperature control module comprising:
a heater plate having a bottom surface secured to the top surface of the top electrode, the heater plate including at least one heater adapted to supply heat to the top electrode to control the temperature of the top electrode;
a cooling plate having a top surface secured to and thermally isolated from a bottom surface of a top plate, the cooling plate adapted to control the temperature of the heater plate and control heat conduction between the heater plate and the top electrode; and
a plurality of electrically and thermal conductive thermal chokes located between, and in thermal contact with, a top surface of the heater plate and a bottom surface of the cooling plate, the thermal chokes adapted to control heat conduction between the heater plate and the cooling plate;
wherein the thermal chokes comprise at least one first ring and a second ring surrounding the first ring, the second ring being non-porous and forming an outer surface of the temperature control module.

8. The showerhead electrode assembly of claim 7, wherein:
the heater plate comprises radial gas distribution passages in fluid communication with a gas supply; and
the top electrode comprises:
an inner electrode member including a plurality of first gas passages;
an outer electrode member which is secured to and surrounds the inner electrode member, the outer electrode member includes a plurality of second gas passages;
a backing plate secured to a top surface of the inner electrode member, the backing plate includes a plurality of radially-spaced plenums in fluid communication with radial gas distribution passages, and third gas passages in fluid communication with respective first gas passages; and
a backing ring which surrounds the backing plate, the backing ring includes a plurality of fourth gas passages in fluid communication with the radial gas distribution passages.

9. The showerhead electrode assembly of claim 8, wherein:
the inner electrode member includes surfaces bonded to the backing plate, outer electrode member and backing ring;
the outer electrode member includes surfaces bonded to the inner electrode member and backing ring;
the backing plate includes surfaces bonded to the inner electrode member and backing ring; and
the backing ring includes surfaces bonded to the backing plate, outer electrode member and inner electrode member.

10. The showerhead electrode assembly of claim 8, wherein the outer electrode member comprises a step extending outwardly at an obtuse angle from a plasma-exposed bottom surface of the inner electrode member.

11. The showerhead electrode assembly of claim 8, wherein the inner electrode member comprises a step extending outwardly at an obtuse angle from a plasma-exposed bottom surface of the inner electrode member.

12. The showerhead electrode assembly of claim 8, wherein:
the heater plate comprises a piece of a metal having heating elements embedded therein, the heating elements are connected to at least one power supply operable to supply power to the heating elements; and
the cooling plate comprises a piece of a metal having liquid channels formed therein, the liquid channels are in fluid communication with at least one source of a temperature-controlled liquid which is supplied to the liquid channels to control the temperature of the cooling plate; or
the heater plate comprises an inner heater plate having at least one inner heating element and an outer heater plate having at least one outer heating element, the inner and outer heating elements connected to separate power supplies operable to supply power to the inner and outer heating elements and control temperature of the inner and outer electrode members.

13. The showerhead electrode assembly of claim 8, wherein:
the cooling plate comprises a bottom surface and a plurality of radially-spaced, concentrically-arranged first grooves in the bottom surface, each of the first grooves has a first height; and
each thermal choke is a ring disposed in a respective first groove in the cooling plate and has a second height which is greater than the first height of the respective first groove in which each thermal choke is disposed such that each thermal choke supports the cooling plate on the heater plate, a gap is defined between the bottom surface of the cooling plate and the top surface of the heater plate, and the top surface of the heater plate and heat is conducted between the heater plate and cooling plate through each thermal choke.

14. The showerhead electrode assembly of claim 13, wherein the first ring has a plurality of through openings or is a sintered porous metallic body.

15. The showerhead electrode assembly of claim 7, wherein:
the cooling plate, the thermal chokes and the heater plate comprise aligned openings; and
a threaded fastener is received in each of the aligned openings to secure the cooling plate, the thermal chokes and heater plate to each other, each threaded fastener includes a washer set adapted to resist loosening of the fastener due to thermal cycling of the heater plate.

16. The showerhead electrode assembly of claim 7, wherein the bottom surface of the top plate comprises radially-spaced, concentrically-arranged second grooves, adjacent ones of the second grooves are separated by annular projections on the bottom surface of the top plate and the top plate is in contact with the top surface of the cooling plate at the annular projections.

* * * * *